United States Patent [19]

Hattori et al.

[11] Patent Number: 5,239,465
[45] Date of Patent: Aug. 24, 1993

[54] METHOD AND SYSTEM FOR LAYOUT DESIGN OF INTEGRATED CIRCUITS WITH A DATA TRANSFERRING FLOW

[75] Inventors: Toshihiro Hattori, Kokubunji; Chihei Miura, Kodaira; Shunsuke Miyamoto, Tokyo, all of Japan

[73] Assignee: Hitachi, Ltd., Tokyo, Japan

[21] Appl. No.: 700,042

[22] Filed: May 7, 1991

Related U.S. Application Data

[63] Continuation of Ser. No. 256,481, Oct. 11, 1988, abandoned.

[30] Foreign Application Priority Data

Oct. 14, 1988 [JP] Japan .................. 62-257102

[51] Int. Cl.$^5$ .................. G06G 7/60; G06F 15/38
[52] U.S. Cl. .................. 364/419.19; 364/DIG. 1; 364/223; 364/223.7; 364/232.8; 364/275.6; 364/275.1
[58] Field of Search .................. 364/488, 489, 490, 491

[56] References Cited

U.S. PATENT DOCUMENTS

| | | | |
|---|---|---|---|
| 4,580,228 | 4/1986 | Noto | 364/491 |
| 4,593,351 | 6/1986 | Hong et al. | 364/200 |
| 4,636,966 | 1/1987 | Yamada et al. | 364/491 |
| 4,651,284 | 3/1987 | Watanabe et al. | 364/491 |
| 4,656,592 | 4/1987 | Spaanenburg et al. | 364/490 |
| 4,815,003 | 3/1989 | Putatunda et al. | 364/491 |
| 4,823,278 | 4/1989 | Kikuchi et al. | 364/491 |

FOREIGN PATENT DOCUMENTS 60-167060 6/1985 Japan .

OTHER PUBLICATIONS

Donald M. Schuler and Ernst G. Ulrich–GTE Laboratories, Incorporated, "Clustering and Linear Placement", pp. 50–56, (Proc. of 9th Design Automation Conference).

*Primary Examiner*—Kevin A. Kriess
*Attorney, Agent, or Firm*—Fay, Sharpe, Beall, Fagan, Minnich & McKee

[57] ABSTRACT

As a basic connection information determined on the basis of a basic information determined in advance between logic elements by paying attention to the flow of data, the present invention includes a structure for transferring data from one data element to another data element, a structure for transferring data from one data element to a plurality of data elements and a structure for transferring data from a plurality of data elements to one data element, decides the sequence of unidimensional placement of sets of elements as the object of the flow of data inside a logic circuit on the basis of these structures, and automatically and quickly determine the initial placement positions of the sets of elements from the sequence thus decided.

14 Claims, 14 Drawing Sheets

FIG. 2

| | | | |
|---|---|---|---|
| BLOCK: REi ; | | | --- 100 |
| INPUT: | IN1 (0:7) | DATA, | --- 101 |
| | IN2 (0:7) | DATA, | --- 102 |
| | SEL1 | CONTROL, | --- 103 |
| | TKφ | CLOCK ; | --- 104 |
| OUTPUT: | OUT1 (0:7)=E(0:7) DATA; | | --- 105 |
| REGISTER: | A(0:7), B(0:7), C(0:7), | | --- 106 |
| | D(0:7), E(0:7); | | --- 107 |
| SEQUENCE : SEQ ; | | | --- 108 |
| | ≪ CONSTANT ≫ | | --- 109 |
| #1 : TKφ | B := IN2 ; | | --- 110 |
| #2 : TKφ | A := IN1 ; | | --- 111 |
| | C := B ; | | --- 112 |
| #3 : TKφ | IF SEL1 THEN D:=A; | | --- 113 |
| | ELSE D:=C; | | --- 114 |
| #4 : TKφ | E := D ; | | --- 115 |
| END ; | | | --- 116 |
| END ; | | | --- 117 |

FIG. 4

| BASIC STRUCTURES OF DATA FLOW | CONTENTS | PRIORITY |
|---|---|---|
| DATA SEQUENCE RELATION | STRUCTURE IN WHICH DATA ARE TRANSFERED FROM ONE SET OF DATA LOGIC ELEMENTS TO ONE SET OF DATA LOGIC ELEMENTS | 1 |
| DATA FORK RELATION | STRUCTURE IN WHICH DATA ARE TRANSFERED FROM ONE SET OF DATA LOGIC ELEMENTS TO SETS OF DATA LOGIC ELEMENTS | 2 |
| DATA JOIN RELATION | STRUCTURE IN WHICH DATA ARE TRANSFERED FROM SETS OF DATA LOGIC ELEMENTS TO ONE SET OF DATA LOGIC ELEMENTS | 3 |

FIG. 7(A)

REGISTER A
REGISTER B
REGISTER C
REGISTER S
REGISTER D
REGISTER E

FIG. 7(B)

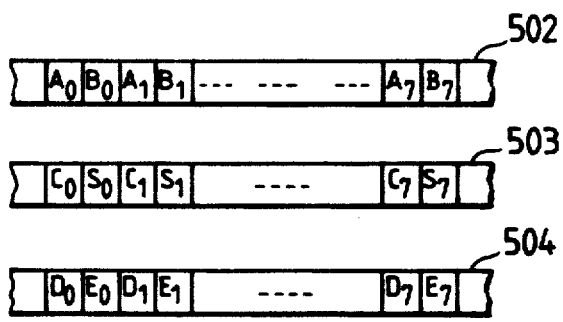

FIG. 8

81 LOGIC ELEMENTS TABLE

| NO. | LOGIC ELEMENT NAME | TYPE NAME | INPUT TERMINAL | OUTPUT TERMINAL | LOGICAL ATTRIBUTE | START BIT | END BIT |
|---|---|---|---|---|---|---|---|
| 1 | A | REGISTER | 1 | 2 | DATA | 0 | 7 |
| 2 | B | REGISTER | 4 |  | DATA | 0 | 7 |
| 3 | C | REGISTER |  |  | DATA | 0 | 7 |
| 4 | D | REGISTER |  |  | DATA | 0 | 7 |
| 5 | E | REGISTER |  |  | DATA | 0 | 7 |
| 6 | S | SELECTOR |  |  | DATA | 0 | 7 |
| 7 | G 001 |  |  |  | CONTROL | - | - |
| 8 | G 002 |  |  |  | CONTROL | - | - |
| 9 |  |  |  |  |  |  |  |

2 INPUT NAND
3 INPUT NOR

82 TERMINAL TABLE

| NO. | TERMINAL NAME | CONNECTION NET | TERMINAL ATTRIBUTE | START BIT | END BIT | NEXT POINTER |
|---|---|---|---|---|---|---|
| 1 | D in | 1 | - | 0 | 7 | 3 |
| 2 | D out | 2 | - | 0 | 7 | - |
| 3 | CK | 3 |  | 0 | 7 | 4 |
| 4 | D in | 2 | - | 0 | 7 | 6 |
| 5 |  |  | CONTROL ONLY |  |  |  |

83 NET TABLE

| NO. | NET NAME |
|---|---|
| 1 | IN 1 |
| 2 | A |
| 3 | TKφ |
| 4 |  |

FIG. 10

- ARRANGE CELLS OF $A_0 B_0 A_1 B_1 -- A_7 B_7$ IN GROUPS AND PLACE IN THE FIRST CELL SEQUENCE
- ARRANGE CELLS OF $C_0 S_0 C_1 S_1 --- C_7 S_7$ IN GROUPS AND PLACE IN THE SECOND CELL SEQUENCE
- ARRANGE CELLS OF $D_0 E_0 D_1 E_1 --- D_7 E_7$ IN GROUPS AND PLACE IN THE THIRD CELL SEQUENCE

FIG. 11

| | | |
|---|---|---|
| BLOCK | : ADD_2 ; | --- 601 |
| INPUT | : IN1 (0:7) DATA, | --- 602 |
| | IN2 (0:7) DATA, | --- 603 |
| | TKφ  CLOCK ; | --- 604 |
| OUTPUT | : OUT1 (0:7) = M(0:7) DATA; | --- 605 |
| REGISTER | : K(0:7), L(0:7), M(0:7); | --- 606 |
| SEQUENCE | : ADD_2 ; | --- 607 |
| | 《CONSTANT》 | --- 608 |
| #1 : TKφ | K := IN1 ; | --- 609 |
| | L := IN2 ; | --- 610 |
| #2 : TKφ | M := ADD(K,L) ; | --- 611 |
| END ; | | --- 612 |
| END ; | | --- 613 |

FIG. 12

121 LOGIC ELEMENTS TABLE

| NO. | LOGIC ELEMENT NAME | TYPE NAME | INPUT TERMINAL | OUTPUT TERMINAL | LOGICAL ATTRIBUTE | START BIT | END BIT |
|---|---|---|---|---|---|---|---|
| 1 | K | REGISTER | 1 | 2 | DATA | 0 | 7 |
| 2 | L | REGISTER | ⋮ | ⋮ | DATA | 0 | 7 |
| 3 | M | REGISTER | ⋮ | ⋮ | DATA | 0 | 7 |
| 4 | G001 | | ⋮ | ⋮ | DATA | 0 | 7 |
| 5 | G002 | | ⋮ | ⋮ | DATA | 0 | 7 |
| 6 | G003 | | ⋮ | ⋮ | CONTROL | - | - |
| 7 | | | | | | | |

3 INPUT EOR
2 INPUT AND 3 OR
2 INPUT NAND

122 TERMINAL TABLE

| NO. | TERMINAL NAME | CONNECTION NET | TERMINAL ATTRIBUTE | START BIT | END BIT | NEXT POINTER |
|---|---|---|---|---|---|---|
| 1 | Din | 1 | - | 0 | 7 | 3 |
| ⋮ | ⋮ | ⋮ | ⋮ | ⋮ | ⋮ | ⋮ |
| 13 | IN 1 | 3 | - | 0 | 7 | 14 |
| 14 | IN 2 | 4 | - | 0 | 7 | 15 |
| 15 | IN 3 | 5 | - | -1 | 6 | - |
| 16 | OUT | 6 | - | 0 | 7 | - |

123 NET TABLE

| NO. | NET NAME |
|---|---|
| 1 | IN 1 |
| 2 | IN 2 |
| 3 | K |
| 4 | L |
| 5 | ANDOR 1 |
| 6 | EOR 1 |
| 7 | M |

METHOD AND SYSTEM FOR LAYOUT DESIGN OF INTEGRATED CIRCUITS WITH A DATA TRANSFERRING FLOW

This is a continuation of co-pending application Ser. No. 07/256,481, filed on Oct. 11, 1988, now abandoned.

BACKGROUND OF THE INVENTION

1. Field of the Invention

This invention relates to design of semiconductor integrated circuits, and more particularly to an automatic layout design method and system.

2. Description of the Prior Art

CAD (Computer Aided Design) or DA (Design Automation) has become indispensable for design of large-scale integrated circuits. Automation of a logic design process has made a progress in recent years and studies have been made vigorously on a system for automatically synthesizing a circuit using real logic elements on the basis of abstract logic description. Japanese Patent Laid-Open No. 167060/1985, for example, describes a method of automatically synthesizing a logic from structure information and behavior information. Japanese Patent Laid-Open No. 88371/1986 discloses a method of synthesizing a logic circuit of desired technology from the description of behavior characteristics.

In the field of automatic layout design, on the other hand, a technique of determining the physical positions of real logic elements (cells) on the basis of connection information of the cells and carrying out automatic wiring between these cells has been put into practical use. In this automatic cell placement processing, iterative refinement of the cell positions is generally conducted so as to primarily minimize an imaginary wiring length.

According to this iterative refinement processing, final placement result will become good if initial placement positions are determined excellently. Therefore, processing for determining the initial placement positions has been examined. For example, Proc. of 9th Design Automation Conference, pp. 50-56, describes the initial placement position determination processing which is referred to as a "clustering method".

Furthermore, "The institute of Electronics & Communication Engineers, Technical Report" CAS-854(1984) "Circuit and System" describes that a good placement result can be obtained by taking the flow of logic of a logic structure into specific consideration when this initial placement position is determined. As the problem to be solved in order to automate the layout for preserving the logic structure, this report mentions a large waste region in this placement result and proposes to arrange the block shape by moving the cells.

According to the conventional methods described above, however, it has been necessary to designate manually the logic structure and to designate manually the relative position relation of the cells so that the number of man-hour is great. In accordance with the method which first makes placement in accordance with the logic structure and then moves the cells to arrange the block shape, the flow of data is disturbed and this method cannot be automated so readily as the layout method having high performance.

SUMMARY OF THE INVENTION

In order to eliminate the problems with the prior art technique described above, the present invention contemplates to provide a method and system which determines a better initial placement position with a shorter calculation time and is suitable for automation.

To accomplish the object described above, the present invention determines the sequence of placement of a set of elements as the object of a data flow inside a logic circuit on the basis of a basic connection information which is determined on the basis of a predetermined basic relation between logic elements by paying a specific attention to the flow of data, and then determines the initial placement position of each element in the set of elements from the sequence of placement described above. The basic connection information includes a first connection information as a structure which transfers data from one data element to another data element, a second connection information as a structure which transfers data from one data element to a plurality of data elements and a third connection information as a structure which transfers data from a plurality of data elements to one data element.

According to the present invention, since those sets of elements which are controlled by the same control signal are handled exclusively, they can be placed adjacent to one another, and the placement positions of the cells can be determined so that the data are caused to flow in one direction. It is therefore possible to prevent elongated wiring of control signal lines, to reduce crossing of data lines and eventually, to determine the initial placement positions which are effective for reducing the area of an integrated circuit. Since the procedure of processing is simple, the method of the invention can be easily automated and needs a shorter calculation time.

BRIEF DESCRIPTION OF THE DRAWINGS

FIG. 2 shows an example of logic description of a behavioral and functional level;

FIG. 4 shows an example of a basic structure of a predetermined data flow and their priority;

FIG. 7(A) shows an example of the uni-dimensional sequence of replacement;

FIG. 7(B) shows an example of a two-dimensional schematic initial placement position;

FIGS. 8 and 12 are memory information structural views showing the structures of output data generated by automatic synthesis;

FIG. 10 is an explanatory view showing an example of schematic initial placement position of logic elements;

FIG. 11 is an explanatory view showing an example of behavioral and functional level description of the second embodiment of the present invention;

DESCRIPTION OF THE PREFERRED EMBODIMENTS

Hereinafter, the first embodiment of the present invention will be described in detail.

Figure 1:
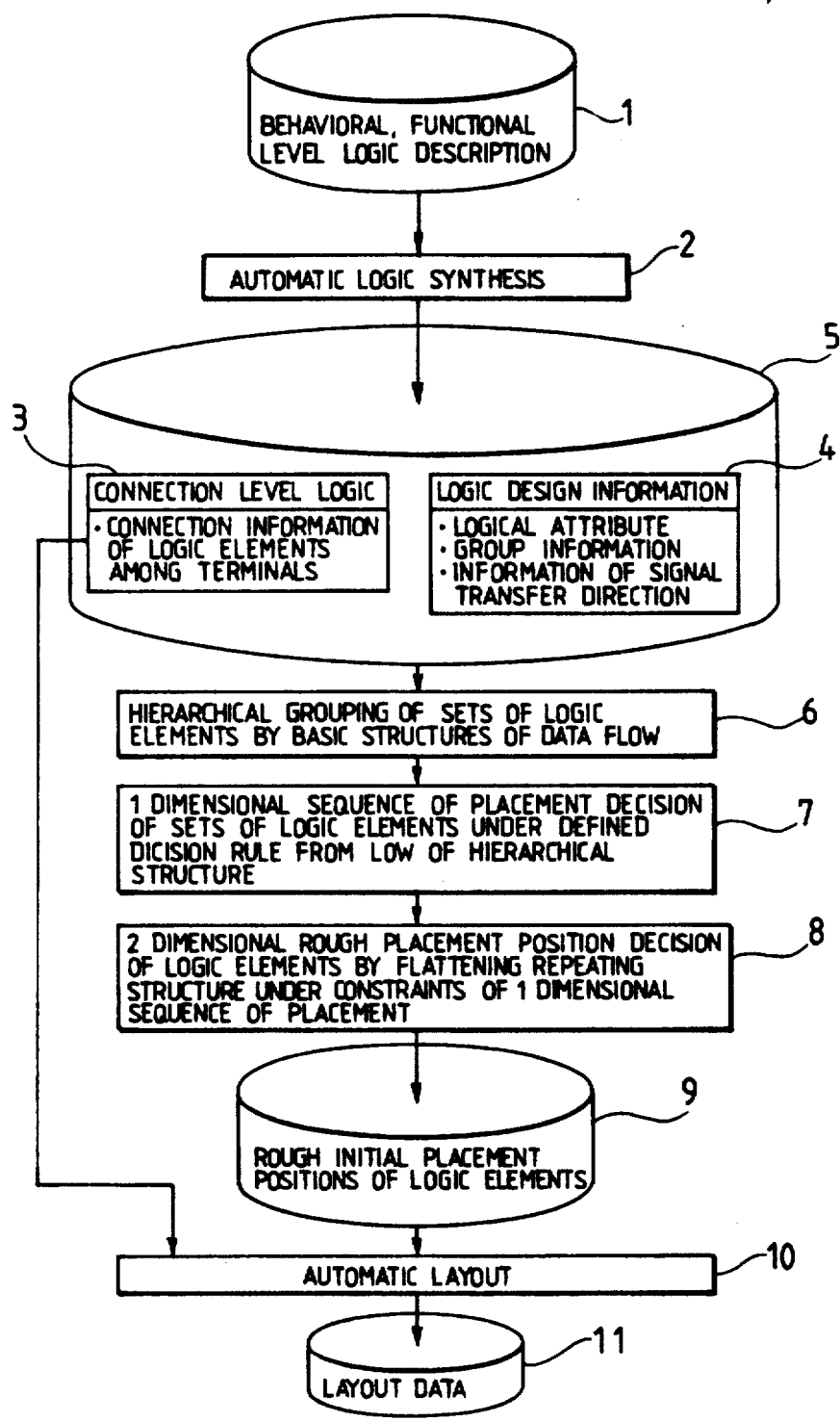
FIG. 1 is a flowchart of the method of the present invention.

FIG. 1 is a flowchart of the layout system in accordance with the present invention.

In FIG. 1, reference numeral 1 represents logic description by hardware description language representing the behavior and function of the circuit. This is the input to an automatic logic synthesis processing. FIG. 2 shows an example of the description method of 1.

Reference numeral 2 in FIG. 1 represents automatic logic synthesis processing, which automatically synthesizes circuit description as the connection information of real logic elements The explanation of such a processing will be hereby omitted because it is described in detail in Japanese Patent Laid-Open No. 167060/1985, for example.

Reference numeral 3 represents logic description which is outputted by the logic synthesis processing and expressed by the connection information of the real logic elements. Automatic layout design has been made conventionally on the basis of this connection description.

Reference numeral 4 represents the information which is helpful for optimization of the layout design other than the wiring information among the information at the time of logic design. In this embodiment the following three kinds of information are used as the logic design information. The first is logical attribute information. This is the attribute which represents whether the logic elements on the circuit are data system logic elements used for data transfer or control system logic elements used for control. The second is group information. It is the information, for example, which represents that a latch group constitutes a register controlled by the same control line. In the connection information as the input to the automatic layout system, the latch group described above is expressed as the individual latches in order for automatic layout to determine the placement positions of the individual cells and wiring of the individual signal lines and the information representing which latches constitute the same original register falls off. More often than not, a selector having the function of selecting one data from a plurality data selects the data which is expressed as a cluster such as 8 bits or 16 bits. In other words, the cells each selecting one bit data constitute a group and this is one of the group information. The third is signal transmission direction information. It is the information that represents from which logic element and to which logic element the signal flows.

Reference numeral 5 represents the information that contains connection level logic 3 and logic design information 4 and is the output of the automatic logic synthesis system. This does not necessarily mean that the logic design information 4 is described independently of the connection level logic 3 but as represented by 5, the logic design information is an additional attribute to the connection level logic. More definitely, as shown in FIG. 8 for example, the connection level logic 3 and the logic design information 4 are described in mixture by a plurality of tables such as a logic element table 81, a terminal table 82, a net table 83, and the like.

Reference numeral 6 represents a hierarchical grouping processing of sets of logic elements as the basic structure of the data flow. This processing extracts the portion which is in conformity with a predetermined basic structure from the circuit. In this embodiment the sets of logic elements belonging to this structure should be disposed adjacent to one another. If a certain element is contained in a plurality of basic structures, priority is given to it in accordance with a predetermined rule to make grouping of sets of logic elements that are contained in the basic structure. If the group thus constituted is regarded as one element, it can be one constituent element of the basic structure. Therefore, hierarchical grouping of the sets of logic elements can be made. According to this processing, since a latch group constituting one register is dealt with as an aggregate, grouping processing is made with the sets of logic elements being the object of processing.

Incidentally, when the structure as the basis of the predetermined data flow is extracted, the portion of the circuit which is in conformity with the structure is extracted with only the data system logic elements being the object while the signal transmission direction is taken into consideration. In other words, the attribute information of the logic, the group information and the signal transmission direction information defined as the logic design information are utilized.

Figure 6A:
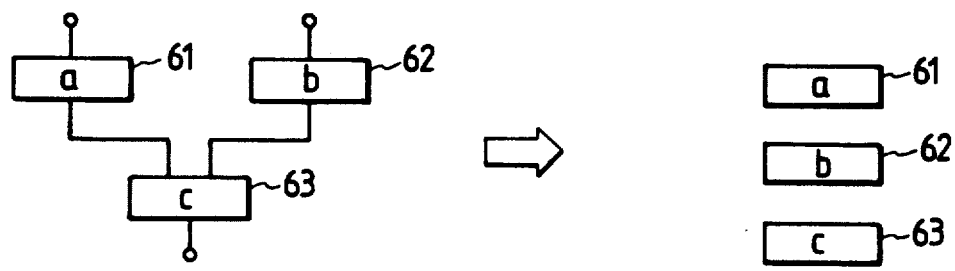
FIGS. 6(A), (B) and (C) show the basic structures as the basis of the data flow and uni-dimensional sequences of placement corresponding to the former.
Figure 6B:
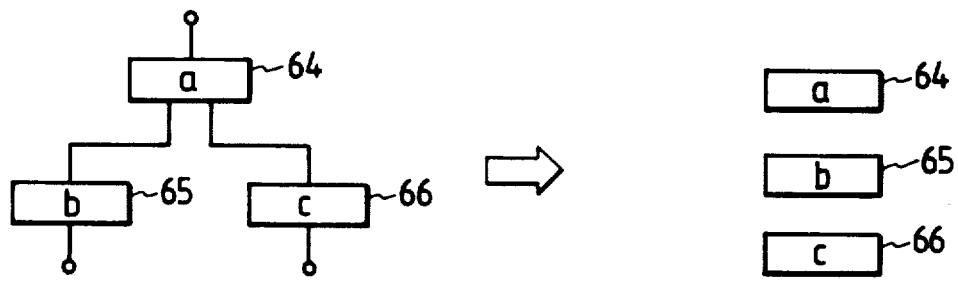
Figure 6C:
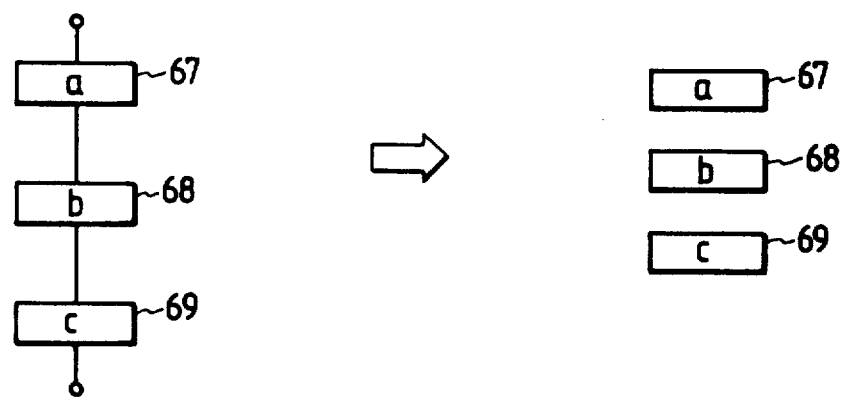

Reference numeral 7 represents a processing for deciding a uni-dimensional sequence of placement of sets of logic elements. Though the logic elements are disposed two-dimensionally on the chip, the uni-dimensional sequence is first decided in order to simplify the processing. The sequence is determined for the whole or part of the logical elements in accordance with a sequence rule on the basis of the hierachical structure of the group by the logic structures obtained at 6. Namely, if the sets of logic elements a, b, c have the placement relationship such as represented by 61, 62 and 63 on the left side of FIG. 6(A), they are arranged once again unidimensionally as shown on the right side of FIG. 6(A). If the sets of logic elements a, b, c are as represented by 64, 65 and 66 in FIG. 6(B) and 67, 68 and 69 in FIG. 6(C), they are rearranged as shown in the drawings, respectively.

Reference numeral 8 represents a processing which determines the two-dimensional rough placement positions of the logic elements In the layout system which is generally referred to as a "standard cell method", a chip or a block is constituted by a cell row placement region and a connection region as shown in FIGS. 7(B). The processing 8 determines the rough and relative placement positions on the chip in accordance with the unidimensional placement sequence obtained at 7.

Reference numeral 9 represents a file that describes the rough initial placement positions of the logic elements. Here, the rough initial placement positions of all or part of the logic elements described in the connection level logic description 3 are described. A definite description example is shown in FIG. 10.

Reference numeral 10 represents automatic layout processing. It receives the connection level logic 3 and the rough initial placement positions of the logic elements obtained at 9 as its input and makes placement connection processing. Namely, the groups that are designated to be alinged at 9 are dealt with as the unit of processing, are then placed preferentially on the cell row designated at 9 and the initial placement positions of the control system logic elements for which the placement positions are not designated at 9 are determined to the positions which are judged most optimal on the basis of the connection information in the same way as in the conventional system. Iterative improvement processing is made so as to shorten the imaginary wiring length from the initial placement positions of all the logic elements thus obtained so that the placement positions can be determined and wiring can be carried out.

Reference numeral 11 represents a file which represents the result of automatic layout. In accordance with the present method the area of the layout result is smaller than the area of the layout result in accordance with the conventional method.

Next, processing will be explained in detail with reference to one circuit example.

FIG. 2 shows an example of the behavioral/functional level logic description at 2 in FIG. 1. Reference numeral 100 represents the start of description statements. Reference numerals 101 to 105 represent input/output declare statements. For instance, 101 represents input terminal of a data system input terminal of an 8-bit width named IN1. Reference numerals 106 and 107 represent declare statements of the registers used. The portions from 108 to 116 are the portions where the behavior of the logic circuit is described. TK$\phi$ represents a clock signal. For instance, 110 represents that data transfer is made from the input terminal IN2 to the register B at the timing of a certain clock TK$\phi$, and 111 and 112 represent that the data transfer from the input terminal IN1 to the register A and the data transfer from the register B to the register C are made in parallel with one another at the timing of a next TK$\phi$ subsequent to the operation of 110.

Figure 3:
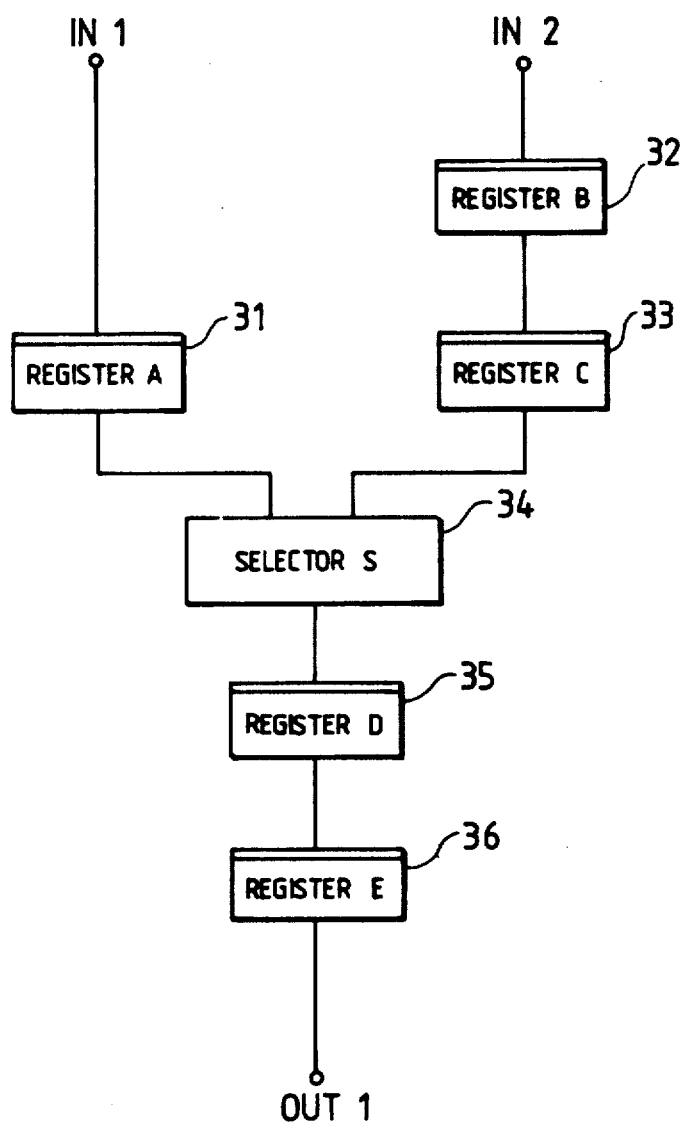
FIG. 3 shows an example of a block diagram of a data system logic.

FIG. 3 is a block diagram of the data system logic of the logic expressed by FIG. 2. In other words, the automatic logic synthesis processing generates the connection information of the data system logic elements such as shown in FIG. 3 and the control system logic that controls the former. For instance, the input of the register D 35 is at times the register A 31 and is the register C 33 in another case. To make such a control selector elements are synthesized automatically and the control logic satisfying the description of FIG. 2 is generated. At this stage, the register A 31, for example, is handled together as a register having an 8-bit width and has the information that each latch constituting the register A 31 constitutes a group.

It also has the information representing that various sets of logic elements are the data system logic elements or the control system logic elements. The signal transmission direction is clearly described, too, by distinguishing the input terminal from the output terminal.

FIG. 8 shows an example of information outputted by the logic automatic synthesis system of this embodiment. The connection information of the logic elements and the logic design information are expressed primarily by three tables. A logic element table 81 is described in such a manner as to correspond to registers or selectors having a bit width or to the logic elements having no bit width. A logic element name 811 is the name inherent to the set of logic elements. A type name 812 represents the function of logic element, that is, the type of cell. Input terminal 813 and output terminal 814 express the input and output terminals of the set of logic elements by the numbers of a terminal table, respectively, and the numbers of terminals on the terminal table are described sequentially in the column of the next pointers of the terminal table. A logical attribute 815 is a flag representing that a given logic element is a logic element of the data system or of the control system. The group information of this logic element is described by use of the columns of a start bit 816 and an end bit 817. In the terminal table 82, the attribute of each terminal of the logic element, the group information and the connected net are described as the numbers on the net table. Here, the logical attribute of the terminal represents, for example, that the terminals corresponding to the input and output of the data among the latch terminals are able to be connected to the data system net but the CK terminal, etc., as the input of the clock is connected only to the control signal. Naturally, the control signal can flow through the data input/output terminals depending on the mode of use of latch but the data signal does not flow through the clock terminal.

All the connection information of the logic elements, the logical attribute information, the group information and the signal transmission direction information are described by such tables.

Next, the grouping processing shown at 6 in FIG. 1 will be explained.

FIG. 4 shows an example of the structure as the basis of data flow that is in advance determined in this embodiment, and its priority.

Figure 5:
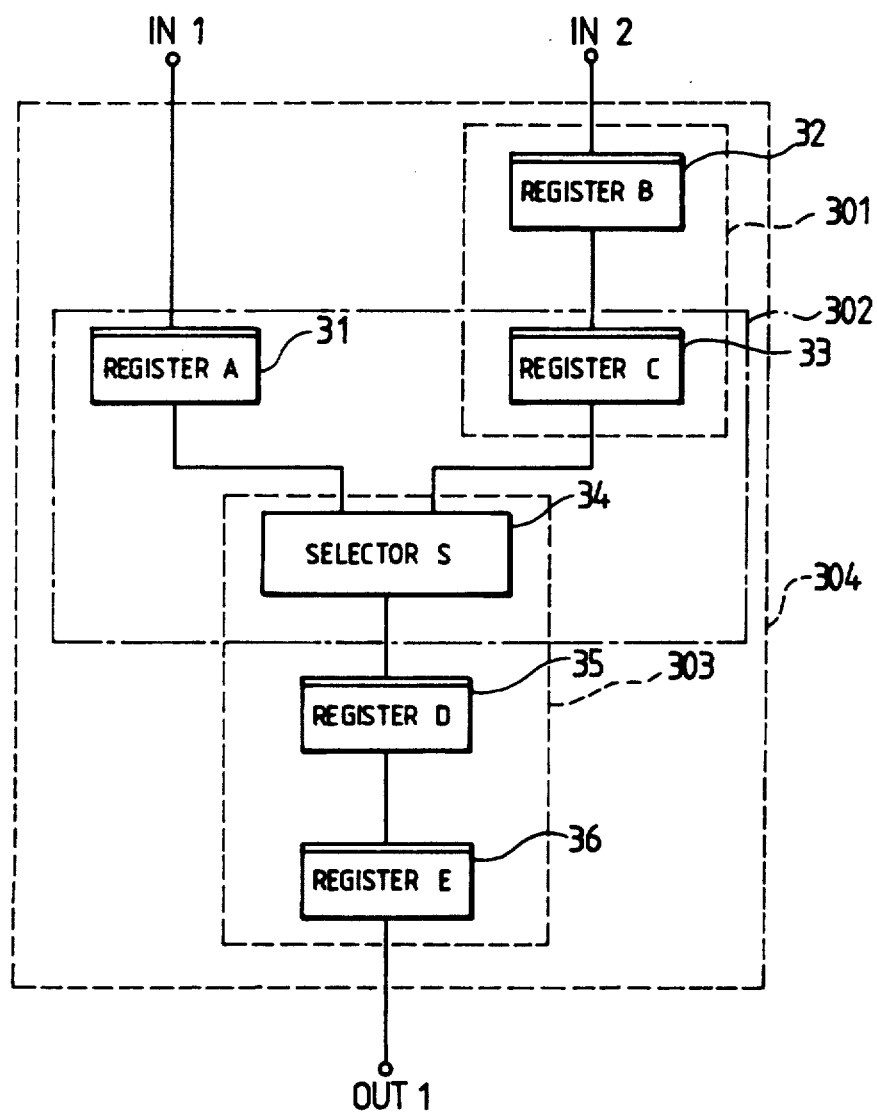
FIG. 5 shows an example of grouping of a set of logic elements on the basis of the basic structure of the data flow.

FIG. 5 shows the structure as the basis of the data flow in the circuit example shown in FIG. 3.

Reference numeral 301 represents that the register B 32 and the register C 33 have a data sequence relation, while 302 represents that the register A 31, the register C 33 and the selector S have data join relation Reference numeral 303 represents that the selector S, the register D and the register E have the data sequence relation In this case, the basic structure is extracted by paying attention only to the connection information of only those terminals of the data system logic elements which can be of the data type.

Figure 9:
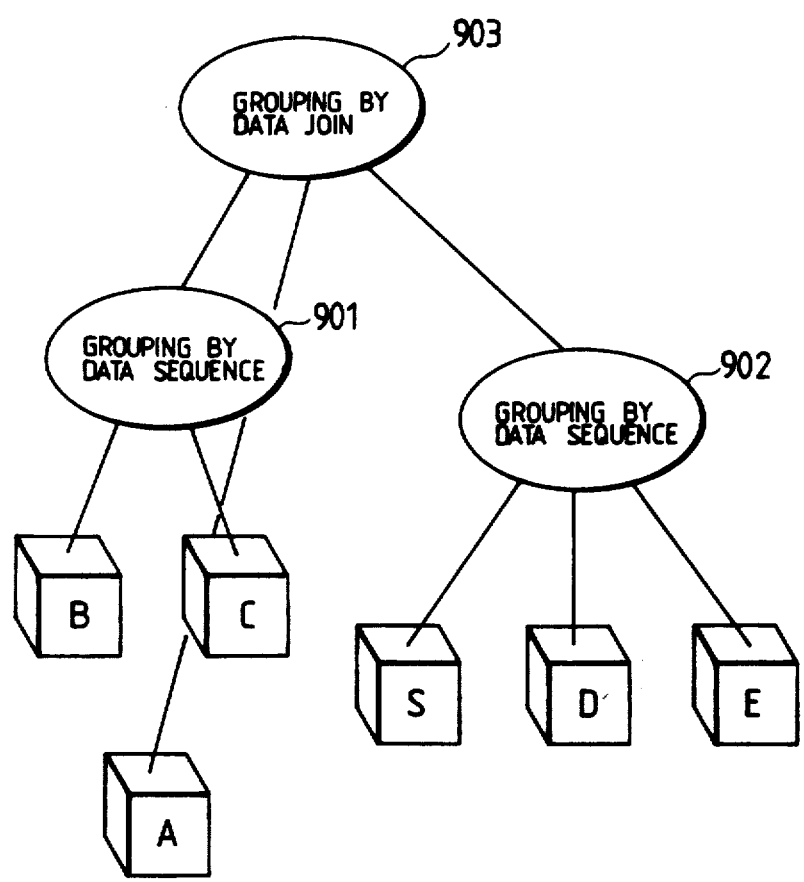
FIG. 9 is an explanatory view of grouping.

In the grouping processing at 6, grouping is effected in accordance with the priority sequence determined in FIG. 4. In other words, the basis structure of direct connection having higher priority in the logic circuit is selected and among the basic structures thus selected, the basic structure to be first grouped is selected by use of a predetermined evaluation function on the basis of the proportion of the internal signal lines, the number of clusters of the internal logic element groups, etc.. When grouping is made, the basic structure to be extracted changes with the changes of the signal transmission relation between the elements as the group and the other logic elements, then the basic structure having higher priority is selected from the basic structure and grouping is made. This processing is carried out repeatedly. As a result, the element group having the signal transmission relation is grouped by one hierarchical structure. FIG. 9 shows an example of the hierarchical structure in this embodiment.

In this embodiment, grouping is made by the structures of 301 and 303. If the result of grouping is regarded as one element, 301, 303 and the register A 31 have the data join relation Therefore, the constituent elements of 304 is next effected Reference numeral 901 represents a group in which the register B 32 and the register C 33 are grouped.

Reference numeral 902 represents a group in which the selector S 34, the register D 35 and the register E 36 are grouped. Reference numeral 903 represents a group in which the group 901 and the group 902 are grouped.

Next, the unidimensional placement position sequence determination processing of the logic element group of 7 will be explained.

FIG. 6 shows the structures as the basis of the data flow and the examples of the unimensional placement position sequence most suitable for the former. Here, the unidimensional placement sequence is decided in such a manner that the data flows from above to below. In the circuit example shown in FIG. 2, the unidimensional placement sequence such as shown in FIG. 7(A) can be obtained.

Subsequently, the two-dimensional rough initial placement position is determined on the basis of the unidimensional placement sequence described above. In this embodiment, an example where the cell row are arranged in three stages as shown in FIG. 7(B). In this processing the arrangement of the logic elements is divided into three parts so that the sum of the width of the cells to be roughly placed in each length of cell row in the transverse direction becomes equal to one another. In this example the register A and the register B are decided to be placed in the first line 502. This embodiment employs the method for the sequence of placement of the individual cells in the first line 502 so that the wiring length of the data line can be shortened by bit-dividing the registers A and B and arranging the latches having the same bit number. As another example, it is possible to shorten the placement length of the control line by placing altogether the register A.

As a result of the processing described above, rough initial placement position of part of logic elements can be obtained. Using the initial placement position of the data system logic elements as a given condition, the initial placement positions of other control system logic elements are determined on the basis of the connection information in accordance with the conventional cluster synthesis method, or the like. The final placement positions are decided from the resulting initial placement positions by effecting iterative refinement.

In this embodiment only the rough initial placement positions of the data system logic elements are decided on the basis of the data flow. However, as another embodiment of the invention, it is possible to decide the rough initial placement position of the control system logic elements in order to cross the data signal lines and the control signal lines at right angles.

According to this embodiment the initial placement positions of the logic elements are determined along the data flow. Moreover, the latches controlled by the same control line are arranged adjacent to one another. As a result of such an initial placement, the chip area can be made smaller and the wiring length can be made shorter as described, for example, in the prior art reference the Institute of Electronics and Communication Engineers Technical Report, CAS-85-4(1985).

Figure 17:
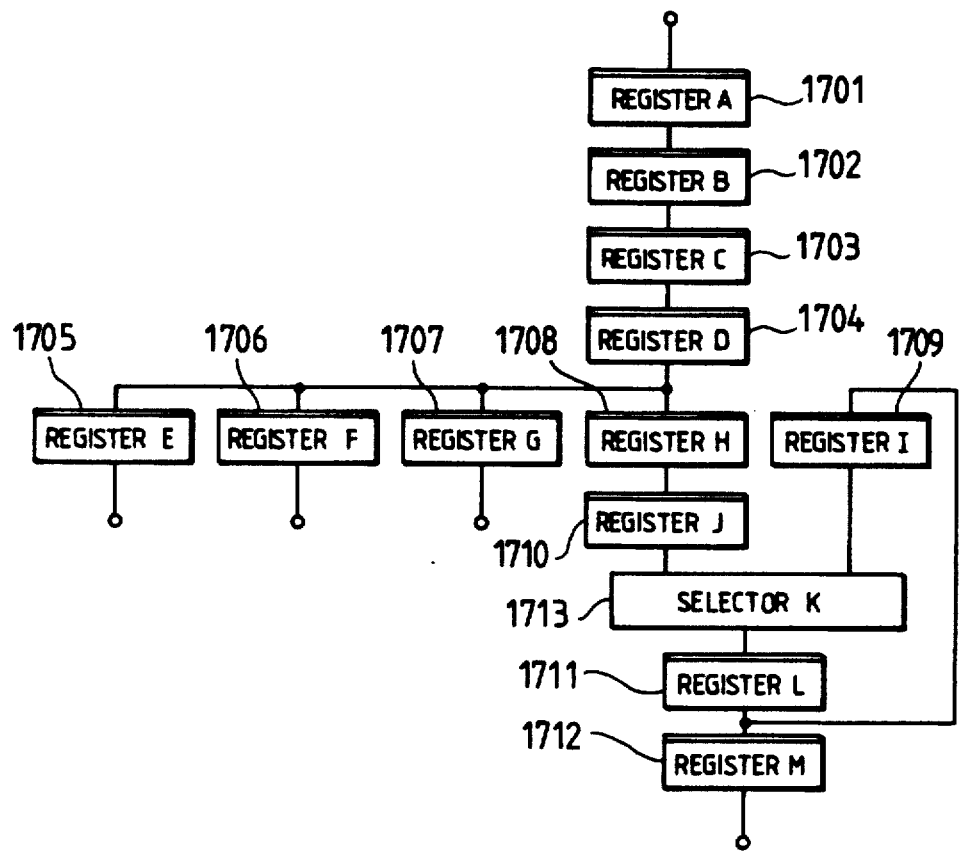
FIG. 17 is a block diagram of an evaluation experimental circuit of the present invention.
Figure 18:
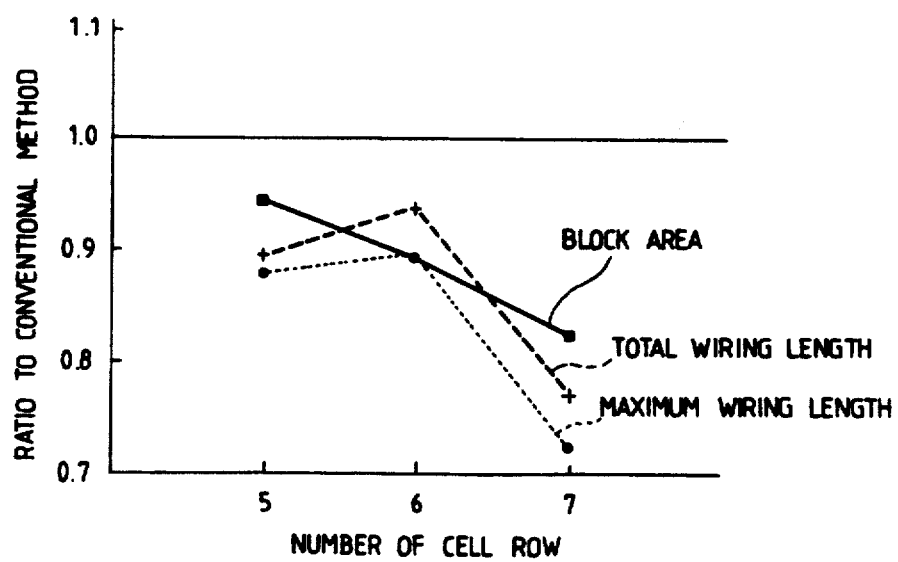
FIG. 18 is a diagram showing the evaluation result of the present invention.

The experimental results evaluated in a practical circuit example on the basis of the method of this embodiment will now be represented. FIG. 17 is a block diagram of an experimental circuit. All the registers 1701-1712 are of a 16-bit wide. It is a logic circuit of a scale of about 1,000 inclusive of the control circuit. The result of layout of such a circuit in accordance with the method of this invention is compared with that of the conventional layout method. FIG. 18 shows the result of comparison. The abscissa in FIG. 18 represents the number of cell row. It has been confirmed that as shown in the diagram, the reduction to 90% in area, to about 85% in the total wiring length and to about 80% in the maximum wiring length can be accomplished on an average.

Next, the second embodiment of the present invention which is directed to logic having a complicated connection information will be represented by another circuit example. The procedures in this embodiment are the same as in the first embodiment shown in FIG. 1.

FIG. 11 shows an example of behavioral/functional level description at 2 in FIG. 1. In this drawing reference numeral 611 represents that the result of addition of the value of the register K and that of the register L is transferred to the register M.

FIG. 12 is a table which expresses the logic connection information outputted by the logic automatic synthesis portion 2 and the logic design information.

Figure 13:
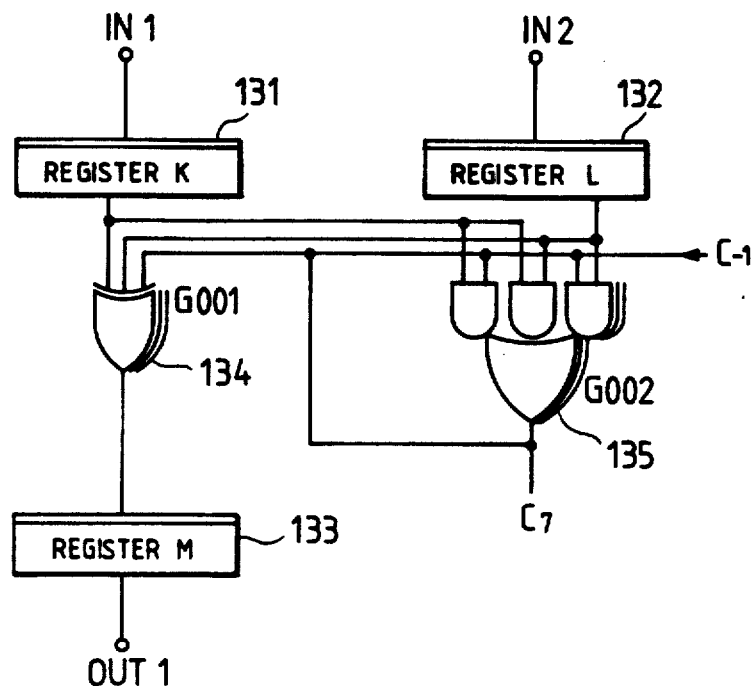
FIG. 13 is a logic block diagram described by the description of FIG. 12.

FIG. 13 is a block diagram of the data system logic of the logic expressed by FIG. 11. Here, the adder is constituted in a ripple carry method by connecting full-adders. In the ripple carry system, the addition result value of an aimed bit and the carry-over value to an upper bit are sequentially calculated from the aimed bit of the data to be added to the carry from a lower bit. Here, the value of an nth bit register M 131, for example, is determined by the exclusive-OR of the nth bit values of the register K 131 and the register L 132 and the carry $C_{n-1}$ from th e(n−1)th bit. Even when the bit position to be connected is different such as the base described above, it can be expressed by making description such that thc bits from −1th bit to the sixth bit shall be connected such as the start bit and end bit of the IN3 terminal in column No. 15 of terminal table 122 in FIG. 12. In FIG. 13, reference numeral 134 represents the logic element G00 1 where a 3-input exclusive-OR cells in 8-bit are altogether described. Reference numeral 135 represents the logic element G00 2 where composite cells having an OR operation function of three 2-input AND results in 8-bit are altogether described.

Figure 14:
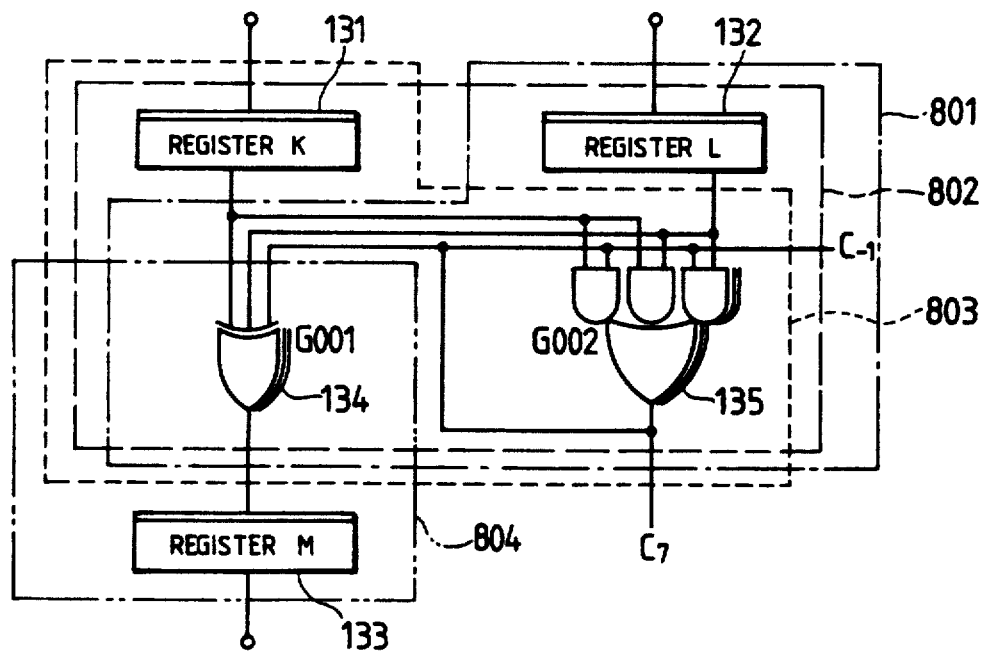
FIGS. 14 to 16 are explanatory views showing the grouping process by the present invention.

Next, the grouping method in this circuit example will be represented. FIG. 14 shows the basic structure before grouping is made. Reference numeral 801 represents the data fork relations on the basis of consideration that the output of the register L 132 is transferred to G00 1 (134) and to G00 2 (135). Reference numeral 802 represents the data join relation on the basis of consideration that the outputs of the register K 131, the register L 132 and G00 2 (135) become the input to G00 1 (134). Reference numeral 803 represents the data fork relation on the basis of the consideration that the output of the register K 131 is transferred to G00 1 (134) and to G00 2 (135). Reference numeral 804 represents the data sequence relation on the basis of consideration that the output of G00 1 is transferred only to the register M. In accordance with the rule that priority is given to the data sequence relation among these basic structures, G00 1 and the register M 133 are grouped by 804 and the result is called a "group 1 (1511)".

Figure 15:
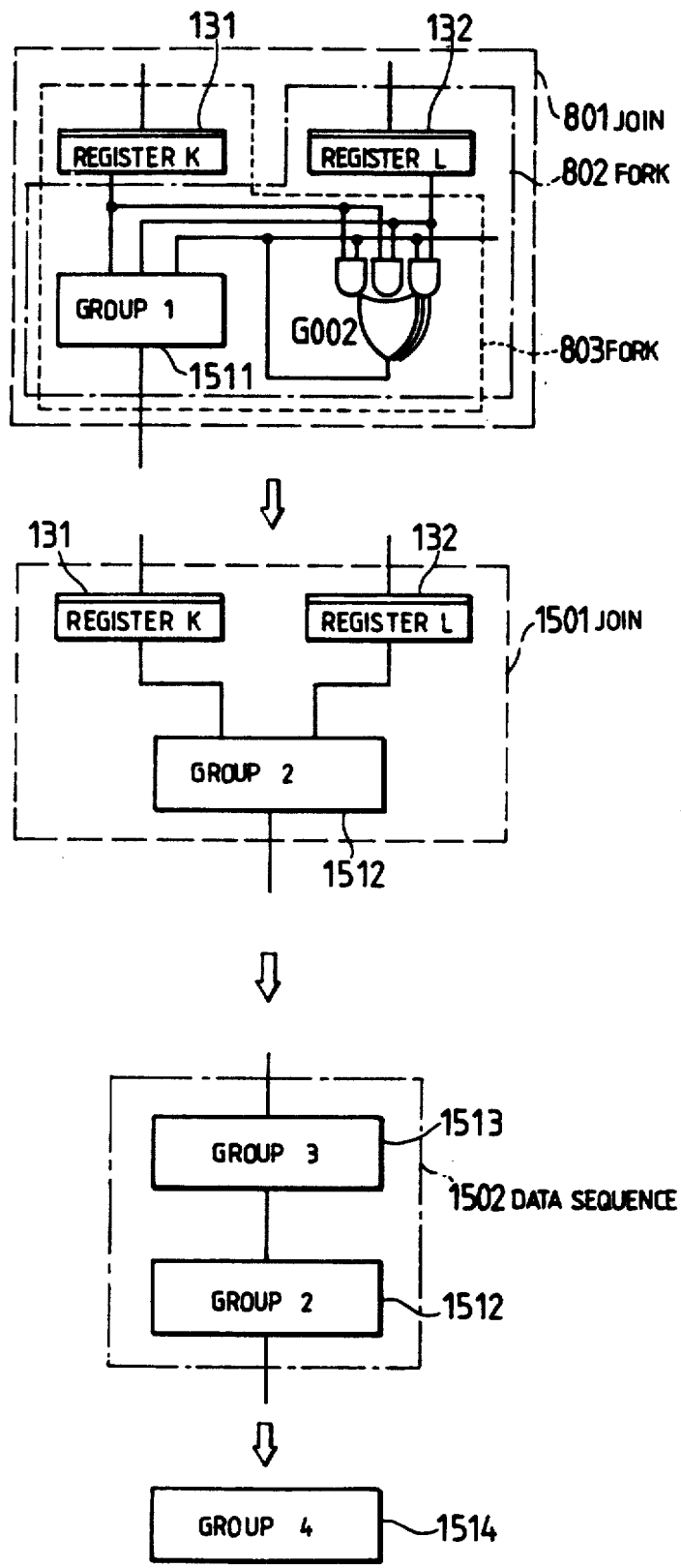

FIG. 15 shows the grouping processing to be carried out next.

Next, grouping is made for the register K 131, the group 1 (1511) and G00 2 (135) that have the data fork relation. In this embodiment, all these three logic elements are not grouped to one group but only the group 1 (1511) and the G00 2 (135) at the fork destination are grouped. As a result, there is obtained the group 2

(1512). Similarly, only the logic elements at the join description are grouped for the data join relation. Thus it is possible to reduce the change of the hierarchical structure due to the difference of sequence of grouping. In this embodiment, the register K 131, the register L 132 and the group 2 (1512) having the data join relation are grouped to prepare the group 3(1513). The group 3 (1513) and the group 2(1512) having the data sequence relation are grouped to prepare the group 4 (1514).

Figure 16:
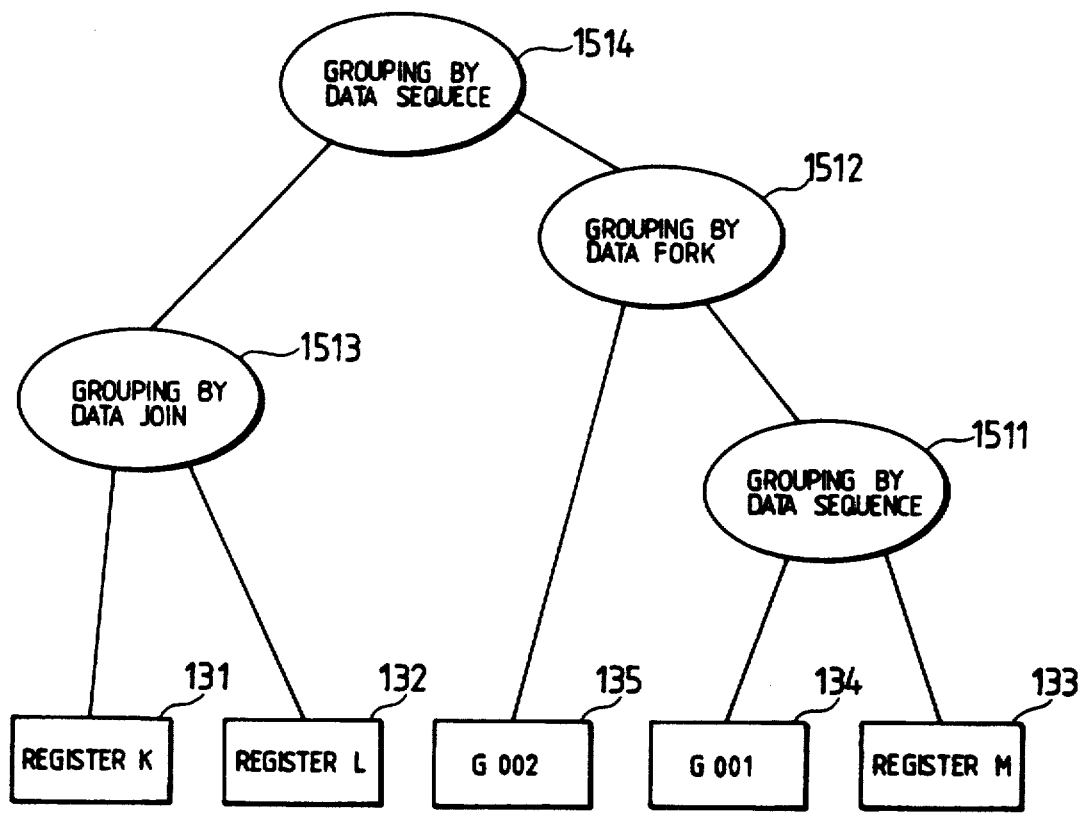

As shown in FIG. 15, when the basic structure is extracted by regarding the result of grouping afresh as the element, there is obtained eventually one group. When this is expressed by the hierarchical tree structure, the result is such as shown in FIG. 16. The unidimensional placement sequence is determined from this tree structure in the same way as in the foregoing embodiment and the rough initial placement positions of the cells are decided.

In accordance with the method described above, the unidimensional placement sequence representing the flow of data can be decided easily from the circuit having a complicated connection relation including a loop and better layout can be therefore carried out.

The present invention has thus been described in detail with reference to the two embodiments thereof. These embodiments can be accomplished by softwares as a method using a large scale computer but can be accomplished by hardware-wise by use of microprocessor, small computer, necessary memory devices, etc., for each of the behavioral/function level description 1, the automatic logic synthesis function 2, the connection level logic 3, . . . , the automatic layout function 10 shown in FIG. 1.

In accordance with the method of the present invention as described above, the result of placement along the flow of logic can be obtained so that the layout area can be made smaller and the wiring length can be made shorter. Since the processing procedures are simple, the present invention can be automated easily and the layout result can be obtained rapidly.

What is claimed is:

1. A layout method performed by an automatic layout system, the method comprising the steps of:
   deciding, in said automatic layout system, a plurality of placement sequences for respective sets of data system elements through which data flows inside a logic circuit to be laid out on the basis of basic connection information being preliminarily determined on the basis of a basic information among data system logic elements in accordance with a flow of non-control data through said data system logic elements;
   deciding, in said automatic layout system, a second sequence which comprises said sets of data system elements in said logic circuit to be laid out, on the basis of connecting relations among the sets of data system elements, said connecting relations being determined in accordance with said flow of non-control data; and,
   deciding, in said automatic layout system, an initial placement positioning of each of said data system logic elements by determining an order of said data system logic elements in said second sequence.

2. The layout method according to claim 1, further comprising a step of deciding, in said automatic layout system, the plurality of placement sequences based on a first connection information as a structure for transferring data from one data element to another data element in a string of data system data elements, a second connection information as a structure for transferring data from one data system data element to a plurality of data system data elements and a third connection information as a structure for transferring data from a plurality of data system data elements to one data system data element.

3. The layout method according to claim 2, further comprising the steps of:
   extracting said first, second and third connection information within the logic circuit; and,
   deciding, in said automatic layout system, a sequence of hierarchical placement of said sets of data system elements overlapping one another by giving highest priority to said first connection information among said first, second and third connection informations thus extracted.

4. The layout method according to claim 1, further comprising the step of deciding, in said automatic layout system, a placement sequence for said respective sets of data system elements which include at least one set of data description elements that express one datum by a plurality of data system elements or a set of processing elements which process altogether one datum by a plurality of data system elements.

5. The layout method according to claim 4, further comprising the step of deciding, in said automatic layout system, a placement sequence for said data system elements wherein each of said data system elements is an element corresponding to one-bit data, and wherein said set of data description elements include a group of latches and said set of processing elements include a selector.

6. The layout method according to claim 5, further comprising deciding the initial placement position of each of said data system elements so that the latches expressing data at the same bit position between the groups of said latches are placed adjacent to one another.

7. The layout method according to claim 2, further comprising a step of deciding, in said automatic layout system, a plurality of placement sequences on the basis of a register, a latch, a gate, an inverter and a group corresponding to said basic connection information.

8. A layout system in an automatic layout system comprising:
   means for deciding a plurality of sequences in the respective sets of data system elements through which data flows inside a logic circuit to be laid out on the basis of basic connection information determined on the basis of a basic information among data system logic elements in accordance with a flow of non-control data through said logic elements;
   means for deciding a second sequence which comprises said sets of data system elements in said logic circuit to be laid out, on the basis of connecting relations among the sets of data system elements, said connecting relations being determined in accordance with said flow of non-control data; and,
   means for deciding an initial placement positioning of each of said data system logic elements by deciding an order of said data system logic elements in said second sequence.

9. The layout system according to claim 8, wherein said basic connection information includes a first connection information as a structure for transferring data from one data element to another data element in a string of data system data elements, a second connection information as a structure for transferring data from one data system data element to a plurality of data system data elements and a third connection information as a structure for transferring data from a plurality of data system data elements to one data system data element.

10. The layout system according to claim 9, further comprising:
   means for extracting said first through third connection informations from within the logic circuit; and
   means for deciding a sequence of hierarchical placement of said sets of data system elements overlapping one another by giving highest priority to said first connection information among said first through third connection informations thus extracted.

11. The layout method according to claim 1, further comprising a step of identifying said flow of non-control data by identifying data elements among said system elements.

12. The layout method according to claim 11, wherein said identifying step includes identifying said data elements by attribute information thereof.

13. The layout method according to claim 1, further comprising a step of replacing cells in said data system elements in accordance with a group information in control information for said data system elements.

14. A placement sequence method performed by an automatic layout system, the method comprising the steps:
   reading data system logic elements, used for logical data transfer, from a file;
   generating basic connection information of the data system logic elements based on a basic relational logic criterion;
   hierarchically grouping sets of the data system logic elements based on a basic structure of a predetermined logical data flow priority, the grouping including in descending order of grouping priority: a data sequence relation grouping, a data fork relation grouping, and a data join relation grouping;
   determining, in said automatic layout system, a one-dimensional placement sequence of a first set of data system logic elements based on a predefined decision rule in such a manner that logic data flows serially therethrough the first set of data system logic elements;
   determining, in said automatic layout system, a two-dimensional placement sequence from the one-dimensional placement sequence such that the first set of data systems logic elements are inter-mixedly arranged in data cells in a first direction transverse to a second direction of the one-dimensional placement sequence and such that the data cells have corresponding lengths; and,
   laying out the integrated logic circuit system according to the two-dimensional placement sequence and interconnecting the integrated logic circuit according to said basic connection information.

* * * * *